United States Patent
Yu et al.

(10) Patent No.: US 6,509,756 B1
(45) Date of Patent: Jan. 21, 2003

(54) METHOD AND APPARATUS FOR LOW CAPACITANCE, HIGH OUTPUT IMPEDANCE DRIVER

(75) Inventors: Leung Yu, Santa Clara, CA (US); Roxanne T. Vu, San Jose, CA (US); Benedict C. Lau, San Jose, CA (US); Huy M. Nguyen, San Jose, CA (US); James A. Gasbarro, Pittsburgh, PA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/823,624

(22) Filed: Mar. 29, 2001

Related U.S. Application Data

(63) Continuation-in-part of application No. 09/539,807, filed on Mar. 31, 2000, now Pat. No. 6,330,193.

(51) Int. Cl.[7] .............................................. H03K 17/16
(52) U.S. Cl. .............................. 326/30; 326/86; 326/87
(58) Field of Search ........................... 326/30, 82, 86, 326/87, 90, 91

(56) References Cited

U.S. PATENT DOCUMENTS

| | | | | |
|---|---|---|---|---|
| 5,134,311 A | * | 7/1992 | Biber et al. | ................. 307/270 |
| 5,185,538 A | * | 2/1993 | Kondoh et al. | ............. 307/270 |
| 5,677,639 A | * | 10/1997 | Masiewicz | ..................... 10/97 |
| 5,930,185 A | | 7/1999 | Wendell | |

OTHER PUBLICATIONS

Fazio, Al, et al., "Intel StrataFlash™ Memory Technology Development and Implementation", Intel Technology Journal Q4 1997, pp. 1–13.

* cited by examiner

*Primary Examiner*—Michael Tokar
*Assistant Examiner*—Anh Q Tran
(74) *Attorney, Agent, or Firm*—Lee & Hayes, PLLC

(57) ABSTRACT

An apparatus is described having a feedback loop. The feedback loop has an output that approaches a steady state as a data line voltage approaches a reference voltage. The apparatus also includes a driving transistor that drives the data line. The driving transistor has an output impedance that is controlled by the feedback loop output, the feedback loop output keeps the driving transistor output impedance within a high output impedance region when the feedback loop output reaches the steady state.

20 Claims, 7 Drawing Sheets

METHOD AND APPARATUS FOR LOW CAPACITANCE, HIGH OUTPUT IMPEDANCE DRIVER

The present patent application is a Continuation-in-part (CIP) of prior application Ser. No. 09/539,807, filed Mar. 31, 2000, entitled; METHOD AND APPARATUS FOR LOW CAPACITANCE, HIGH OUTPUT IMPEDANCE DRIVER now U.S. Pat. No. 6,330,193.

FIELD OF THE INVENTION

The field of invention relates to signal integrity within electronic systems generally; and more specifically, to the biasing of driver transistors within a high output impedance region to maintain acceptable signal integrity.

BACKGROUND

Electronic devices or systems that employ memory typically organize memory components into a memory subsystem. Within most memory subsystems, a device (such as a microprocessor, microcontroller, digital signal processor, memory controller or other device) configured to read data from a memory is coupled to a plurality of memory devices by a data bus.

FIG. 1a shows an exemplary portion of a memory subsystem having a Rambus ASIC Cell (RAC)105 configured to read data from a plurality of memory devices. For simplicity, FIG. 1a only shows two memory devices D4, D24 coupled to the RAC 105 by a single data line 104. However it is to be understood that in typical memory subsystem architectures, data line 104 is normally associated with a larger data bus that couples more than the two memory devices D4, D24 shown in FIG. 1a.

Within each memory device D4, D24 an output driver circuit is shown that is responsible for driving data from its associated memory device to the RAC 105. Referring to the output driver circuit within memory device D4, note that the designed for signal levels driven by this circuit are 1.8 v at one logic level (e.g., "0") and 1.0 v at another logic level (e.g., "1"). Note that those of ordinary skill could design other driver circuit embodiments where a logic level of "1" corresponds to a higher voltage than a logic level of "0".

When the logic level to be-read from memory device D4 is a logic low, all drivers Q1 through Qn are "off" (i.e., both transistors within each driver are in cutoff). Because no current flows through load resistor 103, the voltage appearing on data line 104 is 1.8 v. When the logic level to be read from memory device D4 is a logic high, one or more drivers Q1 through Qn are "on" (i.e., both transistors within an "on" driver are active) which pulls current through load resistor 103 and lowers the voltage on data line 104.

A feedback loop having a comparator 101 and counter 102 automatically configures the number of "on" drivers to correspond to an output voltage level of 1.0 v for logic high outputs. For each driver that is on more total current is pulled through load resistor 103. If the total current corresponds to a voltage on data line 104 below 1.0 v, comparator 101 produces a negative output causing counter 102 to countdown.

The countdown activity of counter 102 turns drivers "off" (e.g., drivers Qn and Qn-1) that were originally "on" until the drop in total current pulled through load resistor 103 corresponds to a resulting increase in data line 104 voltage to the proper voltage of 1.0 v. When the proper voltage is reached, the comparator 101 output becomes neutral (signifying the feedback loop is in a steady state and) causing the countdown activity to stop. A device's feedback circuit typically operates during a set aside calibration period rather when its data is actually being read.

Similarly, if the total current pulled by all "on" drivers corresponds to a voltage on data line 104 above 1.0 v, the comparator 101 output becomes positive causing counter 102 to count up. The countup activity of counter 102 turns "off" drivers "on" until the increase in total current pulled through load resistor 103 corresponds to a resulting decrease in data line 104 voltage to the proper voltage. When the proper voltage is reached, the comparator 101 output becomes neutral (signifying the feedback loop is in a steady state and) causing the countup activity to stop.

A problem associated with memory subsystems designed according to the above described approach occurs during a "back-to-back" read. An example of a back-to-back read is shown in FIG. 1b. In a back-to-back read, two memory devices are read—one after the other. Thus, in FIG. 1b, device D24 is read just before device D4 is read. In order to hasten the timing between back to back reads, memory devices may be read on the rising 106 and falling 107 edges of the same clock as also seen in FIG. 1b.

During back to back reads of a logic high signal, where the second read corresponds to the memory device D4 that is closer to the reading device 105, signal integrity along data line 104 may be flawed as seen in FIG. 1c. FIG. 1c is a "zoom in" of the transition 114 between the D24 read interval 116 and the D4 read interval 117.

An ideal back-to-back read of logic high data appears as two 1.0 v pulses separated by a drop to a reduced voltage 115. At approximately the moment in time 119 that the closest device D4 turns its drivers "on", the farther device D24 also turns its drivers "off". However, because the effect of the farther device D24 having its drivers turned "off" is not seen until a propagation time 108 later (that is proportional to the length of the data line 104 trace between memory device D4 and D24), the voltage on data line 104 behaves as if both devices D4 and D24 are actively pulling current.

Thus, the reduced voltage 115 corresponds to the voltage resulting from both memory devices (e.g., both D4 and D24) effectively having "on" drivers. The reduced voltage 115 should last until a propagation time 108 later when the effect of D24's turning of its drivers "off" is observed .and the voltage on data line properly rises back to 1.0 v.

In many cases, however, the ideal signal just described does not result. Instead of dropping to reduced voltage 115 when device D4 turns its drivers on the data line 104 voltage gradually decays as observed in trace 120. When the effect of the deactivation of D24's drivers is observed (propagation time 108 later), the data line 104 voltage jumps to an elevated level 118 as observed in trace 109. In some instances the difference 110 between elevated voltage 118 and 1.0 v is sufficient to cause D4 read being improperly read as a logic "low" (e.g., 1.4 v or higher) rather than a logic "high".

Thus a flawed signal 120, 109 (shown in FIG. 1c) may be observed along a data line 104 undergoing a back-to-back read. The cause of the flawed signal 120, 109 is related to the Ids v. Vds characteristics of the transistors within the drivers Q1 through Qn that are turned on at time 119. Specifically, the transistors exhibit a reduced output impedance as the voltage on data line 104 drops.

Output impedance is the inverse of the slope of the Ids v. Vds curve. More generically, high output impedance is characterized by a substantially level portion of the transistor curve while low output impedance is characterized by a substantially sloped portion of, the transistor curve. For field effect transistors, Ids is a transistor's drain to source current while Vds is a transistor's drain to source voltage. Thus, referring to the typical Ids v. Vds curve 113 shown in FIG. 1d, high output impedance is observed in curve region 111 (having near zero slope) while low output impedance is observed in curve region 112 (having significant slope). Note the transition between the low 112 and high 111 output impedance regions occurs at a Vds voltage of Vx. Vx is the Vds voltage where velocity saturation is approximately reached.

If Vx is approximately 1.0 v, the output impedance of the driver transistors will drop as the voltage on data line 104 falls below 1.0 v. That is, as the voltage on data line 104 continually falls below 1.0 v, the driver transistors continually pull less and less current. As such, at moment 119 when D4's drivers are turned on, the transistors within these drivers will pull less and less current as the voltage on data line 104 falls. Hence signal 120 correlates to the falling of curve 113 within region 112.

Thus, for driver transistors having a Vx near 1.0 v, the signal integrity problem discussed with respect to FIG. 1c is related to the decay of the driver transistors' output impedance.

BRIEF DESCRIPTION OF THE DRAWINGS

The present invention is illustrated by way of example, and not limitation, in the figures of the accompanying drawings in which like references indicate similar elements and in which:

FIG. 5b shows another embodiment of the approach shown in FIG. 5a.

DETAILED DESCRIPTION

Figure 2A:
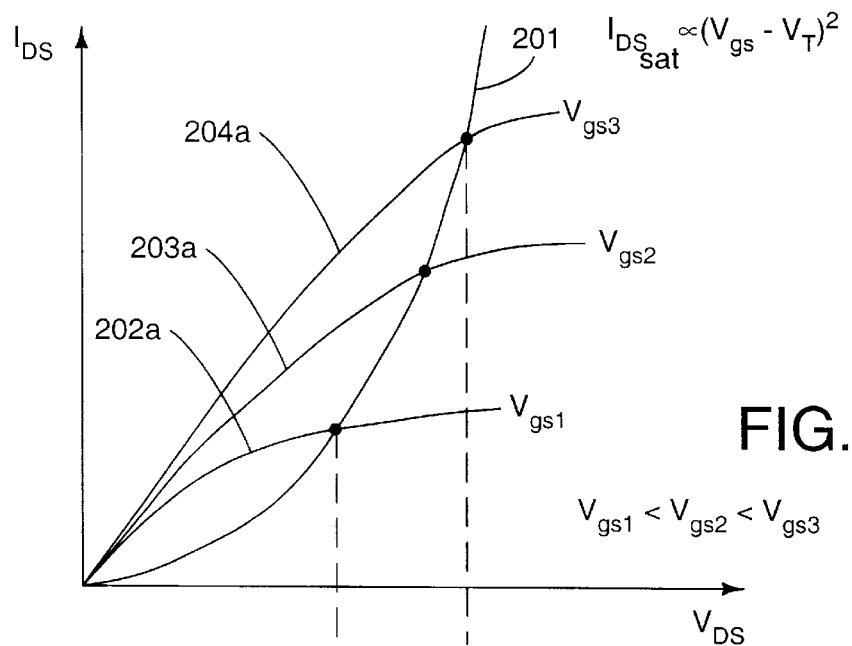
FIG. 2a is a detailed depiction of the Ids v Vds curves associated with a driver transistor.

A solution to the signal integrity problem discussed in the background involves implementing the drivers with transistors having enhanced output impedance. That is, a solution involves employing transistors having a reduced Vx value. FIG. 2a shows a more detailed depiction of the Ids v. Vds characteristics associated With a typical driver transistor.

As is known in the art, Ids increases as Vgs increases (where Vgs is the transistor's gate to source voltage). Thus, as seen in FIG. 2a, transistor curves 202a, 203a, 204a show increasing Ids with respect to one another since the Vgs associated with each curve is also increasing. That is, Vgs1<Vgs2<Vgs3.

Figure 2B:
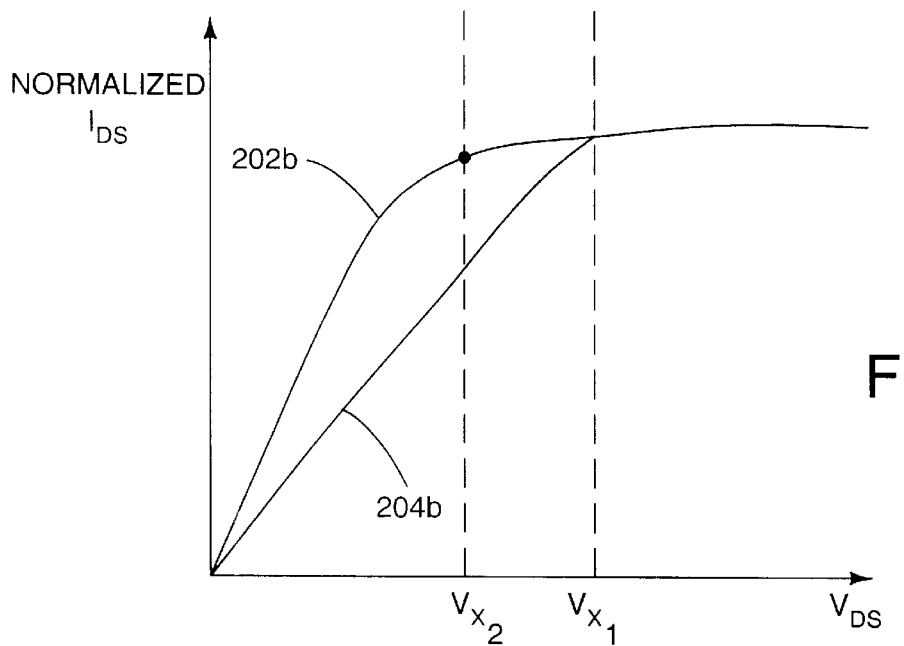
FIG. 2b shows the difference in output impedance, as a function of applied gate voltage, associated with a driver transistor.
Figure 2C:
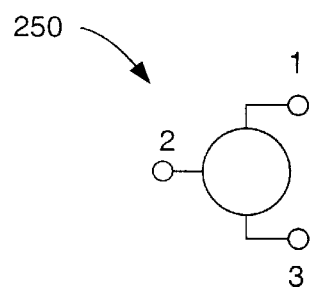
FIG. 2c shows a generic model of a transistor.

Note that a different Vx applies for each curve 202a, 203a, 204a. As is known in the art and as seen in FIG. 2a, Vx approximately varies as $(Vgs-Vt)^2$. Since the variation is to the second power, noticeably improved transistor characteristics may be realized at low Vgs values. That is, a transistor will exhibit higher output impedance at low Vds values (i.e., low Vx) for lower applied voltages. FIG. 2b shows this effect in greater detail. FIG. 2b is a depiction of curves 202a, 204a (of FIG. 2a) normalized by their respective saturation Ids value. Note the curve 202b (which corresponds to curve 202a) does not begin to drop its output impedance until a Vds voltage of Vx2 is reached. However, curve 204b (which corresponds to curve 204a) begins to drop its output impedance at the higher Vds voltage of Vx1.

Thus, an approach to the signal integrity problem discussed in the background is to configure the transistors that drive a data line such that they remain in a high output impedance state as the data line voltage drops. In light of the discussion above with respect to FIG. 2b, transistors having a minimal or lower Vgs will be able to maintain a high output impedance state at lower data line voltages as compared to.transistors having a large applied Vgs value.

Figure 1A:
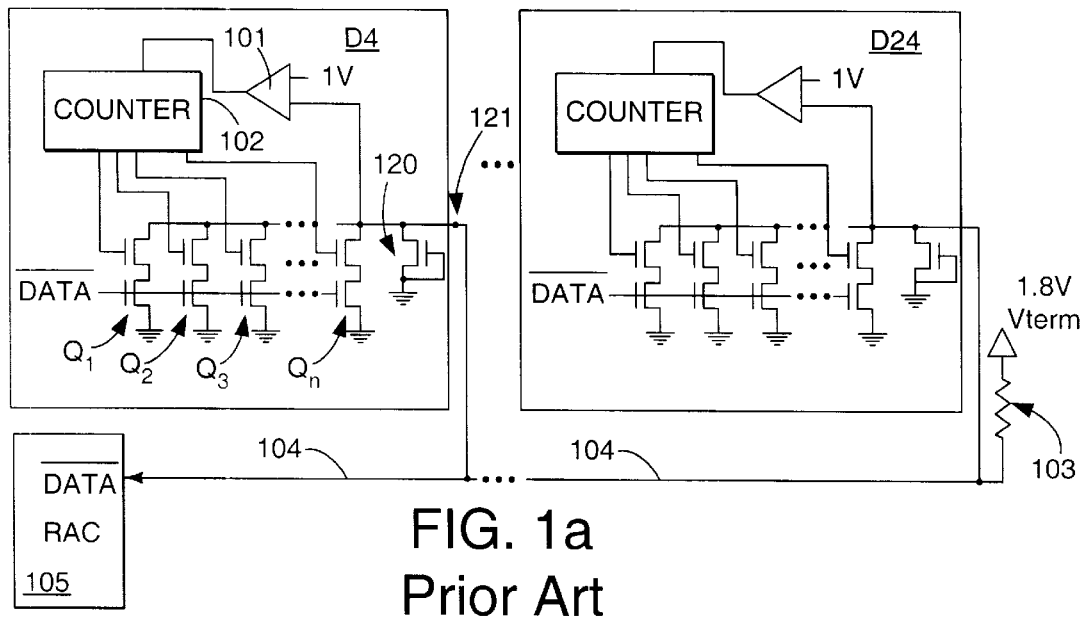
FIG. 1a is a depiction of a memory subsystem (prior art).
Figure 1B:
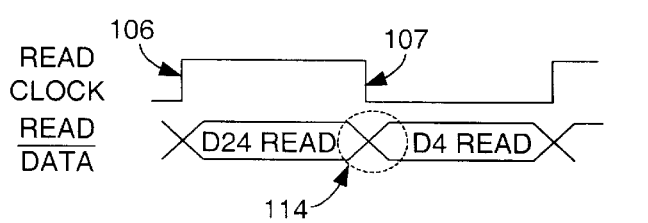
FIG. 1b is a depiction of a back-to-back read within the memory subsystem of FIG. 1a (prior art).
Figure 1C:
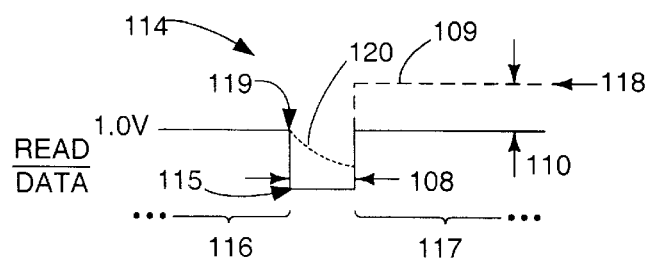
FIG. 1c is a depiction of a signal integrity problem associated with the back-to-back read of FIG. 1b (prior art).
Figure 1D:
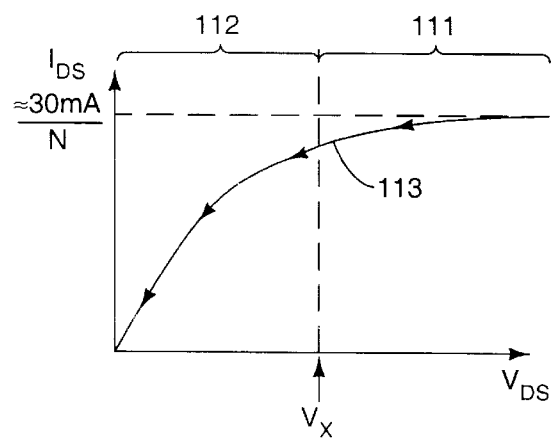
FIG. 1d is a depiction of an Ids v. Vds curve associated with a driver transistor within the memory devices of FIG. 1a (prior art).

Referring to FIG. 1a, a typical counter 102 will provide an output voltage (to the proper number of activated drivers) that is comparable to the supply voltage used to power the counter's 102 output logic. Thus, activated driver transistor inputs coupled to the counter 102 output will receive a large Vgs that is similarly comparable to the supply voltage. Since this may be unacceptable for a high output impedance solution, the prior art feedback loop should be modified in order to apply a reduced gate voltage to the driver transistors.

In an embodiment, the prior art design of FIG. 1a is modified such that the counter 102 outputs are level shifted. Level shifting each counter 102 output will drop the Vgs applied to each driver transistor that is coupled to the counter 102. Level shifting each data bar input will drop the Vgs applied to each driver transistor that is coupled to data bar. Level shifting may be accomplished by various techniques such as inserting, between the driver transistor and counter 102 output, a resistor that is shunted by a device (between the transistor gate and ground) that has a voltage drop (e.g., a diode or another resistor). In other embodiments, the counter 102 may be designed to produce output voltages that are substantially lower than the counter's supply voltage.

Figure 2D:
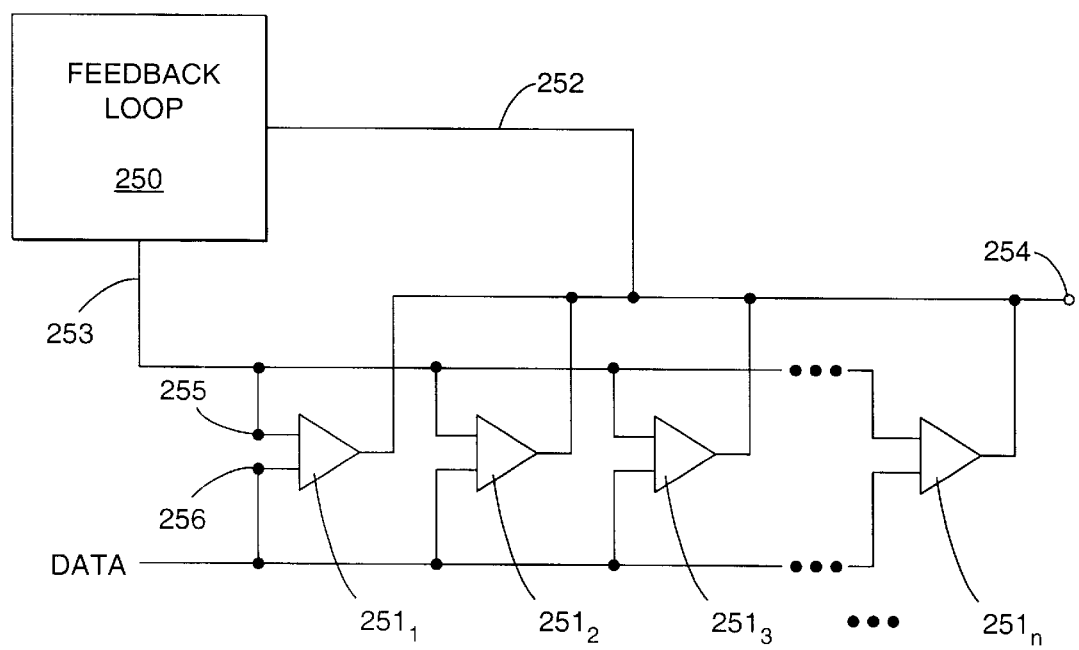
FIG. 2d shows an approach for maintaining driver transistors in a high output impedance state.

Other embodiments correspond to the approach shown in FIG. 2d, which employs drivers $251_1$ through $251_n$, each of which have two inputs (e.g., inputs 255, 256). A first input 255 is coupled to the output of a feedback loop 250. A second input 256 is coupled to a data signal the logical value of which (or its inverse) is to be driven onto a data line 254. The first input 255 is used to control the input applied to a driving transistor (e.g., a Vgs value on a CMOS transistor or a base current on a bipolar transistor) that drives the data line 254. The feedback loop 250 is configured to sample the data line 254 at an input 252 and produce at its output 253 a signal indicative of the voltage level (or need for more or less voltage) on data line 254. Because each driver circuit $251_1$ through $251_n$, is activated by feedback output 253 (unlike the prior art which activates only a portion of the drivers) the proper voltage level is reached on the data line 254 with a lower input applied to the driving transistors. This lower input allows each of the driver transistors to be kept in a high output impedance region as the voltage on data line 254 falls.

As such, the feedback loop 250 effectively regulates the output impedance of one or more driver transistors (which may also be referred to as driving transistors) such that they maintain a high output impedance. A feedback loop 250 is a circuit that has its input 252 coupled to a data line 254, that can be driven by a driving transistor, and has its output 253 coupled to a location (e.g., location 255) where the output impedance of one or more driving transistors can be controlled.

Feedback loops are typically designed to approach a steady state as an error term approaches zero. The error term can be based upon a comparison of a desired data line voltage and an actual data line voltage. For example, if a desired data line 254 voltage for a logic level of "1" is 1.0 v, the error term corresponds to the difference between the actual data line 254 voltage at a logic level of "1" and 1.0 v (e.g., if the actual data line 254 voltage is 1.1 v at a logic level of "1", the error term has a magnitude of 0.1 v).

The feedback loop 250 is designed to affect the one or more driving transistors, in response to the error term, so that the desired data line 254 voltage is reached. For example, if the error term has a magnitude of 0.1 v, the feedback loop output 253 causes the one or more driving transistors to eventually change the data line voltage by 0.1 v (i.e., reduce the data line 254 voltage by 0.1 v if its initial actual voltage is 1.1 v; or increase the data line 254 voltage by 0.1 v if its initial actual voltage is 0.9 v). This may be accomplished either with a single adjustment or through an iterative adjustment process. The feedback loop may be said to reach a steady state (i.e., further adjustments to the data line 254 voltage are not required) when the error term reaches a stable magnitude of 0.0. In other embodiments, the steady state may be reached when the error term falls within a designed for range (e.g. within +/−0.02 v of an error term of 0.0 v)

Note also, that the capacitance on data line 254 (associated with the approach of FIG. 2d) should not increase as compared to the capacitance of the date line 104 associated with the prior approach of FIG. 1a. Capacitance is largely a function of the number of drivers (and the size of the drivers) coupled to these data lines 104, 254. Because the approach of FIG. 2d may be implemented with approximately the same number and size of devices (if the designer so chooses) as may be used with a prior art approach, capacitance on line 254 should not significantly increase by incorporating the approach of FIG. 2. As a result, there should be no significant loss of speed in voltage rise/fall times if the approach of FIG. 2d is implemented.

Note that the approach just described above can be implemented in various driver $251_1$ through $251_n$ embodiments. For example, the drivers may be implemented with field effect driver transistors or bipolar driver transistors. As is known in the art, referring back to FIG. 2c, a transistor 250 may be viewed as a three node device. The second node 2 corresponds to the transistor input such as the gate of a field effect transistor or the base of a bipolar transistor. The second node has an associated bias such as a gate voltage for the field effect transistor or the base current for a bipolar transistor.

The first 1 and third 3 nodes correspond to the drain and source for field effect transistors or the collector and emitter for bipolar transistors, respectively. Since both types of transistors have low output impedance and high output impedance regions (determined by the particular bias established at the second node 2 in conjunction with the magnitude of the particular bias established across the first 1 and third 3 nodes), the approach of applying a bias at the second node 2 sufficient to keep a transistor in a high output impedance region during the presence of a particular data line voltage (which effects the bias established across the first 1 and third 3 nodes) may be employed with either field effect or bipolar transistors. Note also that bipolar transistors are frequently employed in drivers implemented with bipolar as well as BiCMOS process technology.

Drivers $251_1$ through $251_n$ are circuits used to drive data values onto a data line 254. Different driver circuits are possible. For example, many driver circuits have active pull up and/or active pull down. Active pull up typically couples a p type transistor (e.g., PMOS field effect transistor or PNP bipolar transistor) to a first reference voltage (e.g., a supply voltage) to pull up the data line potential to the first reference voltage. Active pull down typically couples an n type transistor (e.g., an NMOS field effect transistor or an NPN bipolar transistor) to a second reference voltage (e.g., a ground reference) to pull down the data line potential to the second reference voltage.

Driver circuits may also have passive pull up or passive pull down. In passive pull up, a load such as a resistor or diode circuit is used to pull up the data line potential; while for passive pull down, a similar load may be used to pull down the data line potential. Various driver circuits may be designed having one or more suitable combinations of the above described pull up or pull down schemes. For example, drivers Q1 through Qn of FIG. 1a employ active pull down with passive pull up (where resistor 103 acts as the passive pull up). Other driver circuits can have both active pull up and active pull down (such as an inverting driver having a PMOS transistor coupled "above" an NMOS transistor in a totem pole arrangement where the data line is coupled between the two devices). Still other driver circuits can have active pull up with passive pull down.

Because these and other driver circuits are possible, the scope of the present discussion should not be limited to the particular drivers discussed in detail herein. Nevertheless, note that signal integrity problems caused by the biasing of a driver transistor within a low output impedance region may be observed within any driver embodiment. For example, an active pull up driver may be improved by lowering the gate to source voltage or lowering the base current of its associated PMOS or PNP transistor.

Figure 3:
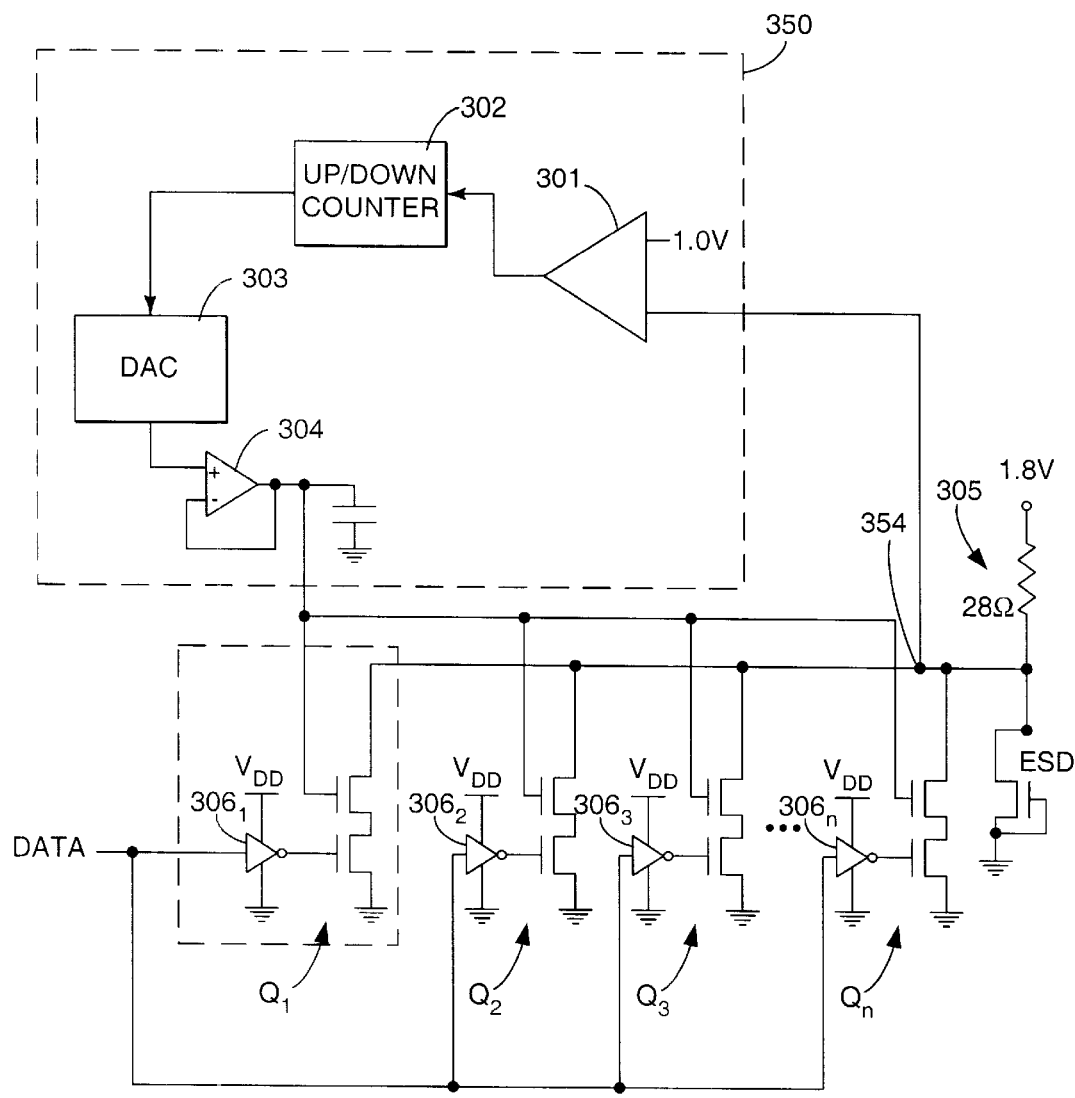
FIG. 3 shows an embodiment of a design that avoids the signal integrity problem of FIG. 1c.

A more detailed embodiment that conforms to the approach of FIG. 2d is shown in FIG. 3. In FIG. 3, circuit 350 corresponds to the feedback loop 250 of FIG. 2d and driver circuit $Q_1$ corresponds to driver circuit $251_1$. The voltage on the data line 354 is sampled by comparator 301, (typically during a calibration period rather than when data is actually being read) when the output is calibrated for a logic high value (e.g., 1.0 v). More details regarding the calibration period are provided further below.

As an example of the operation of the feedback loop 350 of FIG. 3, for a reference voltage set at 1.0 v, if the data line voltage is above 1.0 v, the up/down counter 302 counts up because comparator 301 swings to its high rail. If the data line voltage is below 1.0 v, the up/down counter 302 counts down because comparator 301 swings to its low rail. If the counter 302 counts up, the digital-to-analog converter 303 increases the voltage delivered to voltage follower 304 which, in turn, increases the current pulled through resistor 305. This reduces the data line 354 voltage. If the counter 302 counts down, the digital-to-analog converter 303 lowers the voltage delivered to voltage follower 304 which, in turn, decreases the current pulled through resistor 305. This raises the data line 354 voltage.

Thus a stable feedback loop is observed. That is, when the data line voltage is above 1.0 v, the data line voltage is reduced; and, when the data line voltage is below 1.0 v, the data line voltage is increased. Eventually, the data line will reach a stable voltage of 1.0 v. Note that comparator 301 may be provided with some hysteresis to ensure the stability of the feedback loop. It is important to point out that other feedback loop designs are possible, including those that settle at a data line voltage other than 1.0 volt. As such, the invention should not be construed as limited to the particular embodiment observed in FIG. 3.

Voltage follower 304 may have a unity gain (or non-unity gain) depending upon the range of output voltages supported by the digital-to-analog converter 303. Again note that, unlike the prior art solution, the feedback loop output (i.e., voltage follower 304 output) feeds all drivers Q1 through Qn simultaneously rather than selectively turn some drivers "on" and other drivers "off" based upon the countup or countdown activity of the counter 302.

That is, once the voltage follower 304 output reaches the threshold voltage of the driver transistors, all drivers Q1 through Qn will be "on". As the voltage follower 304 output increases beyond the threshold voltage, all drivers Q1 through Qn sink approximately equal currents in parallel (for embodiments where the drivers are designed with transistors having approximately the same size and fabrication process parameters). Alternate embodiments, however, may vary the gain of one or more drivers such that some drivers drive more (or less) current than other drivers coupled to the data line for a given feedback loop output.

The effect of turning all drivers Q1 through Qn "on" has the effect of pulling the proper current through load resistor 305 with a minimal amount of gate voltage. That is, since, all drivers Q1 through Qn are pulling current, a minimal amount of current needs to be pulled, per driver. This corresponds to a low Vgs voltage, since lower driver currents result from lower applied Vgs voltages.

Note the actual Vgs voltage for a particular implementation will correspond to the number of drivers (i.e., "n") employed in the design. Lower Vgs voltages will be observed as the number of drivers increases. Note also that the approach of FIG. 3 may be implemented with a single driver (i.e., n=1). Thus n may be any integer greater than 0.

Designs having n=1 may be preferable in some applications because a single driver embodiment may result in a larger driver transistor width. Large transistor width corresponds to a high gain transistor (because width is measured perpendicular to current flow). High gain corresponds to a lower Vgs for a particular output current. High gain transistors maintain a higher output impedance state for a lower Vgs (as compared to lower gain transistors) as a result. Furthermore, implementing a single driver (with a high gain driver transistor) within approximately the same amount of semiconductor surface area that would be used for a multiple driver embodiment will keep the capacitance of these embodiments comparable. As a result, even though a large transistor is used, no appreciable increase in capacitance will be realized.

Figure 4:
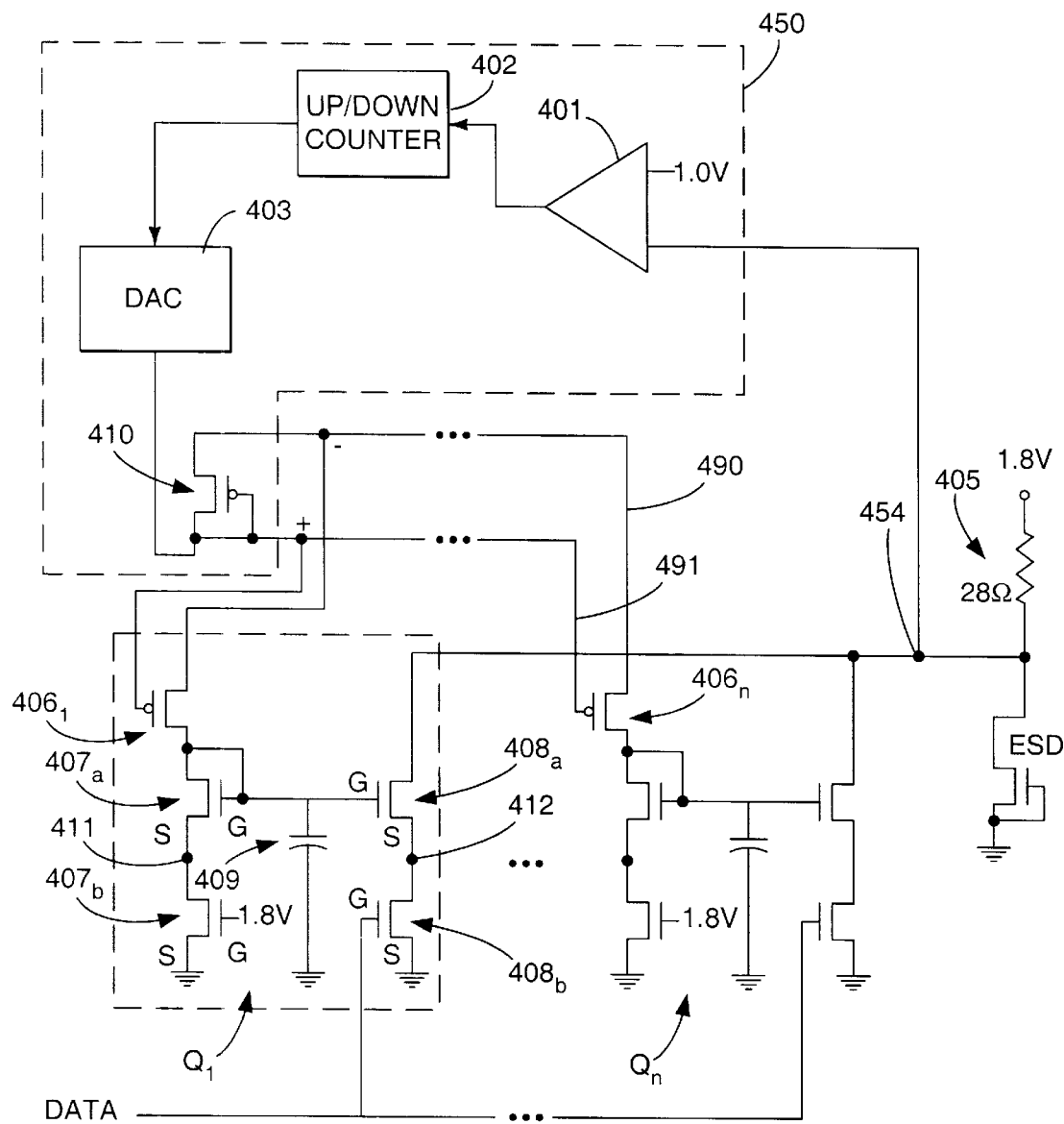
FIG. 4 shows another embodiment of a design that avoids the signal integrity problem of FIG. 1c.

Another embodiment that conforms to the approach of FIG. 2d is shown in FIG. 4. Circuit 450 corresponds to the feedback loop 250 and driver $Q_1$ corresponds to driver $251_1$. Note that the feedback loop 450 has two outputs 490, 491. The feedback of loop of FIG. 4 operates similar to the feedback loop of FIG. 3, however, the digital-to-analog converter 403 of FIG. 4 is configured to convert the countup or countdown signal to an analog current (unlike the digital-to-analog converter 303 of FIG. 3 which converts the countup or countdown signal to an analog voltage).

In an embodiment, an amount of current corresponding to the analog output current $I_{DAC}$ (which propagates into the digital-to-analog converter 403 and therefore may be viewed as an output signal with negative polarity) is distributed equally at drivers Q1 through Qn because each of the drivers Q1 through Qn are designed with approximately identical transistors (i.e., same gate width, doping, etc.); although other embodiments may choose to have drivers designed with different gains (which may be implemented with different transistors per driver). For simplicity, FIG. 4 only shows two drivers, Q1 and Qn. Again, n may be any integer greater than 0. Similar to the approach of FIG. 3, the embodiment shown in FIG. 4 operates with all drivers "on" in order to minimize the gate voltage applied to the driver transistors responsible for pulling current through load resistor 405.

In the embodiment shown in FIG. 4, drivers Q1 through Qn are designed with current mirrors. In a current mirror design, the behavior of driver transistors 407a,b (in response to the digital-to-analog converter 403 output current $I_{DAC}$) is used to control the driver transistors 408a,b that pull current through load resistor 405. Note that if the magnitude of the digital-to-analog converter 403 output current $I_{DAC}$ is sufficient to achieve the proper data line 454 voltage, the current mirror design within each driver Q1 through Qn may have unity gain.

That is, the current pulled by transistor 408a may be approximately identical to the mirror current I$mirror$ through transistor 407a. In other embodiments, these currents may be different in order to properly translate the magnitude of the digital-to-analog-converter 403 output current $I_{DAC}$ to the current magnitude pulled through the resistor 405.

In the embodiment of FIG. 4, PMOS transistor 410 acts as an active load with a Vds drop having a magnitude that may be approximated as $Vt+(Ids/Gm)^{0.5}$ (where Gm is the transistor transconductance). The Vds voltage drop across PMOS transistor 410 is used to clamp the voltage across the source and gate of each driver's PMOS transistor (e.g., PMOS transistor $406_1$). The relative size of the PMOS transistor 410 to the PMOS transistors $406_{1-n}$ can be adjusted to design the mirror current flow to each driver Q1 through Qn, in light of the digital-to-analog converter 403 output current $I_{DAC}$. For example, PMOS transistor 410 may be tailored to flow 10 mA of current for a Vgs of 0.68 v while the PMOS transistor (e.g., transistor $406_1$) within each of 10 drivers may be tailored to flow 1 mA of mirror current at a Vgs of 0.68 v. In this example, the ten drivers are designed to evenly pull (at 1 mA per driver) mirror current from node 490.

Once the mirror current through each driver is determined, the Vgs applied to driver transistor 408a is controlled by the voltage drop across the active load formed by driver transistor 407a. In one approach, transistors 407b and 408b are scaled such that nodes 411, 412 have approximately the same voltage. For equal currents pulled through transistors 407a and 408a, the scaling will be 1:1.

Since nodes 411 and 412 have approximately equal voltages, the Vgs of transistors 407a, 408a will also be approximately equal. Thus, a desirably low Vgs value may be applied to transistor 408a by controlling the voltage drop across the active load embodied in transistor 407a. Those of ordinary skill can tailor the dimensions of these transistors to produce the proper Vgs for the range of currents to be pulled through them. In this manner, low applied Vgs may be used to realize high output impedance for low data line 454 voltages.

The current that runs through a totem pole structure (such as transistor 408a over transistor 408b) is defined by the device having the lowest Vgs (for equally sized transistors). Thus, the data signal does not need to be level shifted in the embodiment of FIG. 4 because of the current mirror approach. Since transistor 407b has a gate voltage set at the supply voltage (e.g., 1.8 v as applied to resistor 405 of FIG. 4,) its mirror transistor 408b can receive a full supply voltage at the gate voltage from the data signal.

Figure 5A:
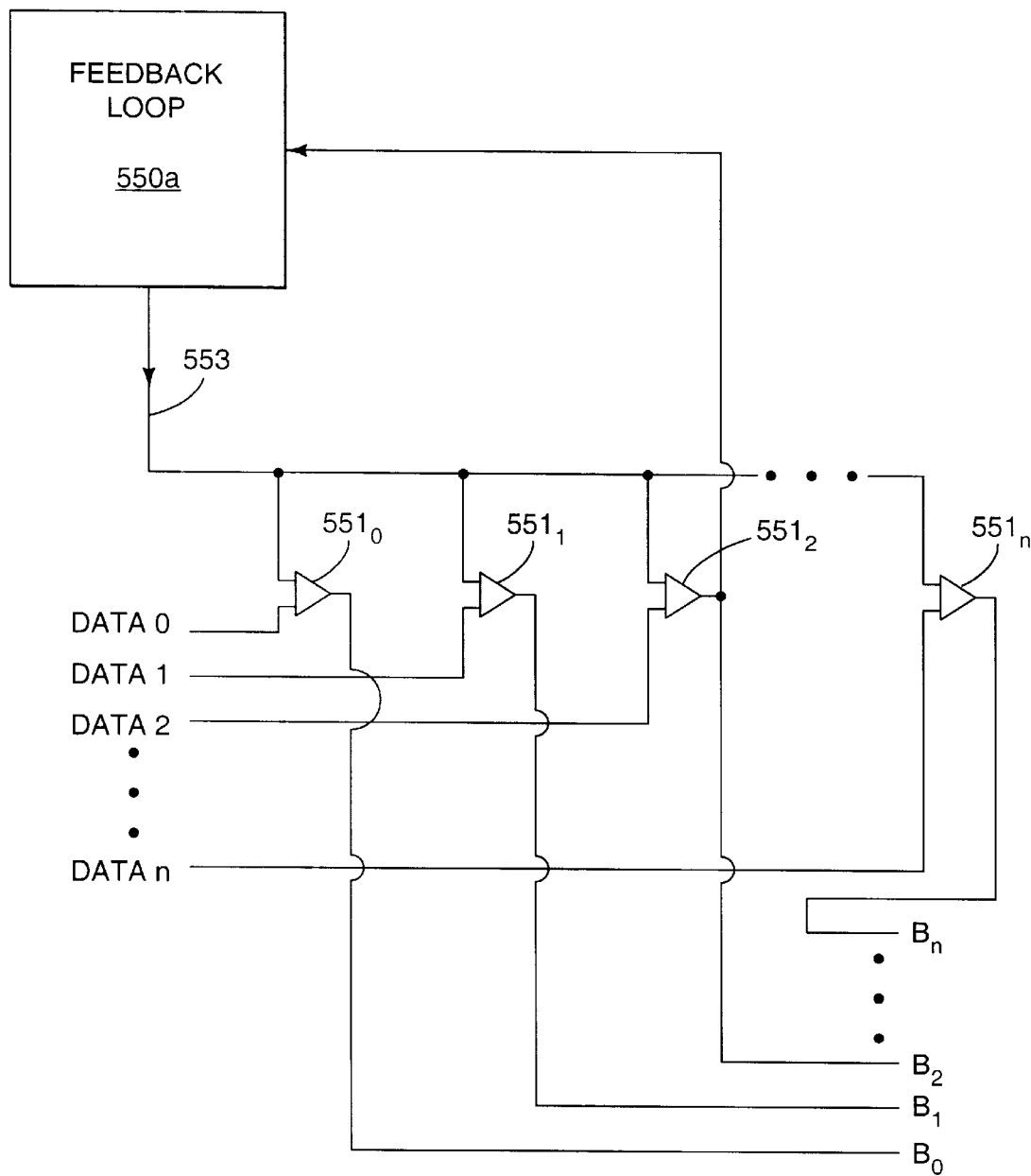
FIG. 5a shows an approach for driving a plurality of data lines with driver transistors in a high output impedance state.

FIG. 5a shows an approach for driving a plurality of data lines having driver transistor(s) in a high output impedance state. In FIG. 5a, feedback loop output 553 drives each of a plurality of drivers $551_1$ through $551_n$, similar to the approach shown back in FIG. 2d. Each driver $551_1$ through $551_n$, however, drives its own associated data line. For example, as seen in FIG. 5a, driver $551_n$ drives data line $B_n$, driver $551_3$ drives data line $B_2$, etc. In an embodiment, data lines $B_\varnothing$ through $B_n$ correspond to data lines used on a bus such as a memory data bus or a memory address bus. Note that any of drivers $551_1$, through $551_n$ may each include a plurality of drivers/driving transistors in order to maintain a high output impedance state. For example, driver $551_3$ of FIG. 5 may be comprised of drivers $251_1$ through $251_n$ of FIG. 2.

In the approach of FIG. 5a as well as other similar approaches, the feedback loop output 553 (which controls the output level of each driver $551_1$ through $551_n$) is determined from the sampling of at least one data line. As seen in FIG. 5a, data line $B_2$ is sampled as the feedback loop 550a input. Here, the output voltage on data lines $B_\varnothing$ through $B_n$ are based upon the sampling of data line $B_2$. Thus the voltage level on one data line (e.g., $B_2$) is used to set the voltage level on another data line (e.g., $B_\varnothing$). The example of FIG. 5a shows an embodiment where a single data line ($B_2$) output is used to control the outputs on the other data lines ($B_\varnothing$, $B_1$, $B_n$, etc.).

Figure 5B:
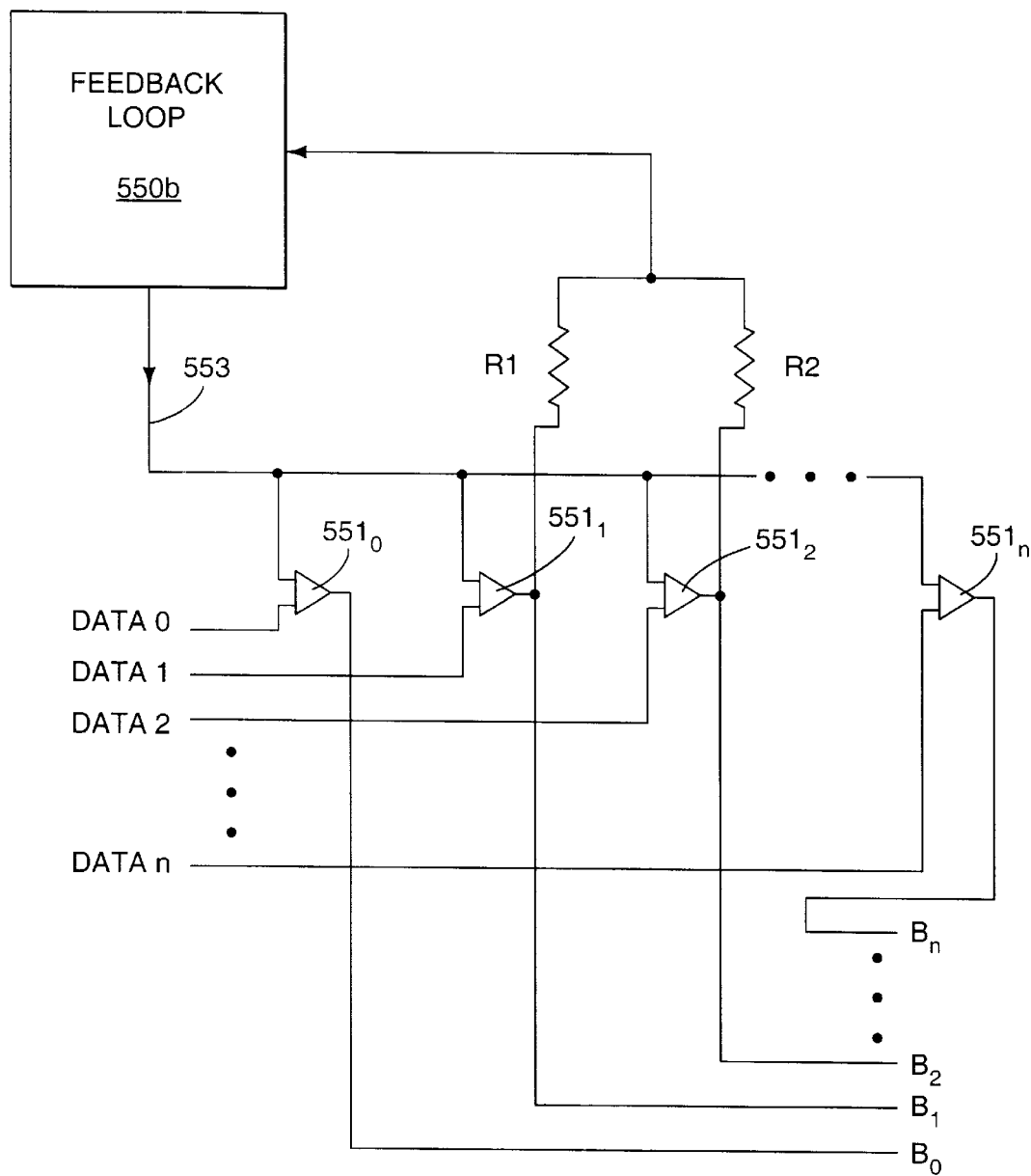

In other cases a plurality of data line outputs may be sampled to determine the feedback loop output 553. FIG. 5b shows an example. In FIG. 5b, data lines $B_1$ and $B_2$ are sampled. The plurality of sampled data line outputs may be averaged or otherwise combined to produce a single input to the feedback loop 550b that is reflective of the output levels, as a whole, appearing on the sampled data lines. For example, as seen in FIG. 5b, resistors $R_1$ and $R_2$ are coupled together at the feedback loopback 550b input as well as to each respective sampled data line $B_1$, $B_2$. The coupling of resistors R1 and R2 at the feedback loop 550b input produces a single input that reflects the output levels, as a whole, appearing on both data line $B_1$ and data line $B_2$.

As alluded to above, in any of the exemplary embodiments discussed above, the feedback loop can be utilized during a calibration period. That is, the appropriate feedback loop output (i.e., that provides for a high output impedance driving transistor) is determined prior to the sending of live "customer" data over the data lines that are driven by the drivers.

During the calibration period, in one embodiment, the data line is driven to a logic high value and the feedback loop is allowed to "settle" to a stable position. This stable position (which may be referred to as the feedback loop's steady state) is then held for future transmissions of live data over the data line. For example, referring to the embodiment of FIG. 3, the steady state corresponds to a fixed up/down counter output value that "sets" the drivers such that their corresponding transistors maintain a high output impedance state when the data line voltage is driven to a logic high (e.g., 1.0 v). Once the up/down counter value settles, its value is held and the calibration period is terminated. Live data can then be driven onto the data line. In this particular embodiment, note that when the data line is driven to a logic low (e.g., 1.8 v), the feedback loop output is irrelevant because current does not substantially flow through the load resistance.

It is important to point out that although much of the above discussion has focused upon implementations having logic voltage levels of 1.8 v and 1.0 v, those of ordinary skill will be able to implement solutions for applications having different voltage levels. Note also that embodiments of this invention may be implemented not only within a semiconductor chip but also within machine readable media. For example, these designs may be stored upon and/or embedded within machine readable media associated with a software design tool used for designing semiconductor devices. Examples include VHSIC Hardware Description Language (VHDL) netlists, Verilog Register Transfer Level (RTL) netlists, and transistor level (e.g., SPICE or SPICE related files) netlists. Note that such netlists may be synthesized as well as synthesizable. Machine readable media also includes media having layout information such as a GDS-II file. Furthermore, netlist files or other machine readable media for semiconductor chip design may be used in a simulation environment to perform the methods of the designs described above.

Thus, it is also to be understood that embodiments of this invention may be used as or to support software programs executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
   a feedback loop having an output that approaches a steady state as a data line voltage approaches a reference voltage; and
   a driving transistor that drives said data line, said driving transistor having an output impedance that is controlled by said feedback loop output, said feedback loop output keeping said driving transistor output impedance within a high output impedance region when said feedback loop output reaches said steady state;

wherein said feedback loop output corresponds to an output voltage; and wherein said feedback loop further comprises a digital to analog converter operable to generate said output voltage.

2. The apparatus of claim 1 wherein said feedback loop output voltage rises if said data line voltage exceeds said reference voltage.

3. The apparatus of claim 1 wherein said feedback loop further comprises a digital counter coupled to said digital to analog converter, wherein said output voltage is representative of a count value maintained by said digital counter.

4. The apparatus of claim 1 wherein said driving transistor is a field effect transistor.

5. The apparatus of claim 4 wherein said driving transistor is an N-type field effect transistor.

6. The apparatus of claim 4 wherein said driving transistor is a P-type field effect transistor.

7. The apparatus of claim 1 wherein said driving transistor is a bipolar transistor.

8. The apparatus of claim 1 further comprising a second driving transistor, said second driving transistor having an output impedance that is controlled by said feedback loop output, said feedback loop output keeping said second driving transistor output impedance within a high output impedance region when said feedback loop output reaches said steady state.

9. The apparatus of claim 8 wherein said second driving transistor drives said data line.

10. The apparatus of claim 8 wherein said second driving transistor drives a second data line.

11. A method, comprising:

a) comparing a data line voltage with a reference voltage;

b) regulating, in response to said comparing, an output impedance of a driving transistor that drives said data line, said regulating keeping said driving transistor within a high output impedance region when said data line voltage reaches said reference voltage, said regulating approaching a steady state as said data line voltage approaches said reference voltage;

wherein said feedback loop output corresponds to an output voltage; and wherein said feedback loop output voltage is an analog voltage, said method further comprising converting a digital representation of said feedback loop output into said analog voltage.

12. The method of claim 11 wherein said feedback loop output voltage rises if said data line voltage exceeds said reference voltage.

13. A method, comprising:

a) comparing a data line voltage with a reference voltage;

b) regulating, in response to said comparing, an output impedance of a driving transistor that drives said data line, said regulating keeping said driving transistor within a high output impedance region when said data line voltage reaches said reference voltage, said regulating approaching a steady state as said data line voltage approaches said reference voltage; and further comprising holding said feedback loop output after said steady state has been reached.

14. The method of claim 13 wherein said feedback loop output corresponds to an output voltage.

15. The method of claim 13 wherein said feedback loop output corresponds to an output current.

16. The method of claim 15 wherein said feedback loop output current rises if said data line voltage exceeds said reference voltage.

17. The method of claim 15 wherein said regulating in response to said comparing further comprises regulating an output impedance of a second driving transistor that drives said data line, said regulating keeping said second driving transistor within a high output impedance region when said data line voltage reaches said reference voltage, said regulating approaching a steady state as said data line voltage approaches said reference voltage.

18. The method of claim 17 wherein said second driving transistor drives said data line.

19. The method of claim 17 wherein said second driving transistor drives a second data line.

20. The method of claim 13 further comprising transmitting live data over said data line via said driving transistor, said held feedback loop output keeping said driving transistor within said steady state.

* * * * *

UNITED STATES PATENT AND TRADEMARK OFFICE
CERTIFICATE OF CORRECTION

PATENT NO. : 6,509,756 B1  
DATED : January 21, 2003  
INVENTOR(S) : Yu et al.

It is certified that error appears in the above-identified patent and that said Letters Patent is hereby corrected as shown below:

Title page,
Item [57], ABSTRACT,
Line 2, replace "loop-has" with -- loop has --.

Column 3,
Line 67, replace "With" with -- with --.

Column 6,
Line 14, replace "Drivers 251, through 251," with -- Drivers $251_1$, through $251_n$, --.

Column 9,
Line 24, replace "drivers 551," with -- driver $551_n$, --.

Signed and Sealed this

Nineteenth Day of August, 2003

JAMES E. ROGAN  
*Director of the United States Patent and Trademark Office*